United States Patent
Lee et al.

(10) Patent No.: US 7,745,308 B2
(45) Date of Patent: Jun. 29, 2010

(54) METHOD OF FABRICATING MICRO-VERTICAL STRUCTURE

(75) Inventors: Myung Lae Lee, Busan (KR); Jong Hyun Lee, Gwangju (KR); Sung Sik Yun, Gwangju (KR); Dae Hun Jeong, Gwangju (KR); Gunn Hwang, Seoul (KR); Chang Auck Choi, Daejeon (KR); Chang Han Je, Daejeon (KR); Jae Yong An, Osan-si (KR)

(73) Assignees: Electronics and Telecommunications Research Institute, Daejeon (KR); Gwangju Institute of Science and Technology, Gwangju (KR)

( * ) Notice: Subject to any disclaimer, the term of this patent is extended or adjusted under 35 U.S.C. 154(b) by 0 days.

(21) Appl. No.: 12/417,114

(22) Filed: Apr. 2, 2009

(65) Prior Publication Data

US 2010/0009514 A1    Jan. 14, 2010

(30) Foreign Application Priority Data

Jul. 8, 2008    (KR) .................. 10-2008-0066015

(51) Int. Cl.
*H01L 21/00* (2006.01)
(52) U.S. Cl. .................. 438/455; 438/456; 438/700
(58) Field of Classification Search .................. 438/455, 438/456, 700
See application file for complete search history.

(56) References Cited

U.S. PATENT DOCUMENTS

| | | | | |
|---|---|---|---|---|
| 6,084,257 A | * | 7/2000 | Petersen et al. ............. | 257/254 |
| 6,316,796 B1 | * | 11/2001 | Petersen et al. ............. | 257/254 |
| 6,773,942 B2 | * | 8/2004 | Tu .............................. | 438/29 |
| 6,892,575 B2 | * | 5/2005 | Nasiri et al. ................. | 73/504.12 |
| 6,939,473 B2 | * | 9/2005 | Nasiri et al. ................. | 216/2 |
| 6,946,314 B2 | * | 9/2005 | Sawyer et al. ............... | 438/50 |
| 6,988,408 B2 | * | 1/2006 | Cho ............................ | 73/504.14 |
| 7,104,129 B2 | * | 9/2006 | Nasiri et al. ................. | 73/514.29 |
| 7,223,624 B2 | * | 5/2007 | Wu et al. ..................... | 438/52 |

(Continued)

FOREIGN PATENT DOCUMENTS

KR    100300002 B1    6/2001

OTHER PUBLICATIONS

D. H. Jeong et al., "Fabrication and Characterization of Capacitive Micro Inclinometer with a High Resolution," Proceedings of the 10$^{th}$ Korean MEMS Conference, 2008, pp. 139-140.

(Continued)

*Primary Examiner*—Laura M Menz (57) ABSTRACT

A method of fabricating a micro-vertical structure is provided. The method includes bonding a second crystalline silicon (Si) substrate onto a first crystalline Si substrate by interposing an insulating layer pattern and a cavity, etching the second crystalline Si substrate using a deep reactive ion etch (DRIE) process along a [111] crystal plane vertical to the second crystalline Si substrate, and etching an etched vertical surface of the second crystalline Si substrate using a crystalline wet etching process to improve the surface roughness and flatness of the etched vertical surface. As a result, no morphological defects occur on the etched vertical surface. Also, footings do not occur at an etch end-point due to the insulating layer pattern. In addition, the micro-vertical structure does not float in the air but is fixed to the first crystalline Si substrate, thereby facilitating subsequent processes.

9 Claims, 10 Drawing Sheets

U.S. PATENT DOCUMENTS

| | | | |
|---|---|---|---|
| 7,238,621 B2 * | 7/2007 | Krishnamoorthy et al. | 438/745 |
| 7,247,246 B2 * | 7/2007 | Nasiri et al. | 216/2 |
| 7,250,112 B2 * | 7/2007 | Nasiri et al. | 216/2 |
| 7,335,527 B2 * | 2/2008 | Sawyer et al. | 438/50 |
| 7,458,263 B2 * | 12/2008 | Nasiri et al. | 73/504.12 |
| 7,621,183 B2 * | 11/2009 | Seeger et al. | 73/504.12 |
| 2002/0017133 A1 * | 2/2002 | Cho | 73/504.02 |
| 2002/0071169 A1 * | 6/2002 | Bowers et al. | 359/291 |
| 2002/0195417 A1 | 12/2002 | Steinberg | |
| 2004/0065638 A1 * | 4/2004 | Gogoi | 216/2 |
| 2004/0102021 A1 * | 5/2004 | Sawyer et al. | 438/456 |
| 2004/0177689 A1 * | 9/2004 | Cho | 73/504.14 |
| 2005/0081633 A1 * | 4/2005 | Nasiri et al. | 73/514.29 |
| 2005/0082252 A1 * | 4/2005 | Nasiri et al. | 216/2 |
| 2005/0166677 A1 * | 8/2005 | Nasiri et al. | 73/514.16 |
| 2005/0170656 A1 * | 8/2005 | Nasiri et al. | 438/700 |
| 2005/0172717 A1 * | 8/2005 | Wu et al. | 73/514.34 |
| 2006/0014358 A1 * | 1/2006 | Sawyer et al. | 438/412 |
| 2006/0101912 A1 * | 5/2006 | Wu et al. | 73/514.34 |
| 2006/0219006 A1 * | 10/2006 | Nasiri et al. | 73/504.12 |
| 2007/0012653 A1 * | 1/2007 | Nasiri et al. | 216/2 |
| 2008/0048211 A1 * | 2/2008 | Khuri-Yakub et al. | 257/204 |
| 2008/0115579 A1 * | 5/2008 | Seeger et al. | 73/504.12 |
| 2010/0009514 A1 * | 1/2010 | Lee et al. | 438/455 |
| 2010/0026779 A1 * | 2/2010 | Yonehara et al. | 347/238 |

OTHER PUBLICATIONS

S. S. Yun et al., "Fabrication of scalloping-free and footing-free vertical structures using crystalline etching of (110) wafer," Proceedings of the 10$^{th}$ Korean MEMS Conference, 2008.

Erno H. Klaassen et al., "Silicon fusion bonding and deep reactive ion etching: a new technology for microstructures," Sensors and Actuators A, 1996, pp. 132-139.

Sangwoo Lee et al., "The Surface/Bulk Micromachining (SBM) Process: A New Method for Fabricating Released MEMS in Single Crystal Silicon," Journal of Microelectromechanical Systems, Dec. 1999, pp. 409-416, vol. 8, No. 4.

Sung-Sik Yun et al., "A photolithography based silicon nanowire fabrication using wet etching of (110) silicon" Proceedings of the 10$^{th}$ Korean MEMS Conference, 2008, pp. 83-84.

* cited by examiner

METHOD OF FABRICATING MICRO-VERTICAL STRUCTURE

CROSS-REFERENCE TO RELATED APPLICATION

This application claims priority to and the benefit of Korean Patent Application No. 10-2008-0066015, filed Jul. 8, 2008, the disclosure of which is incorporated herein by reference in its entirety.

BACKGROUND

1. Field of the Invention

The present invention relates to a method of fabricating a micro-vertical structure and, more specifically, to a method of fabricating a micro-vertical structure with a planar vertical surface without causing morphological defects or footings.

2. Discussion of Related Art

Micro-electro-mechanical systems (MEMS) refers to the integration of mechanical elements, sensors, actuators, and electronic circuits on a common silicon (Si) substrate through microfabrication technology. MEMS is being applied in a wide range of fields including sensors, actuators, and micromachines.

In general, fabricating a MEMS device involves forming a micro-vertical structure by etching a Si substrate using a deep reactive ion etching (DRIE) technique.

However, when the Si substrate is etched using the DRIE technique, morphological defects, scallops, microloading effect, and footings may occur on the Si substrate. This will now be described in more detail with reference to FIGS. 1A through 1C.

Figure 1A:
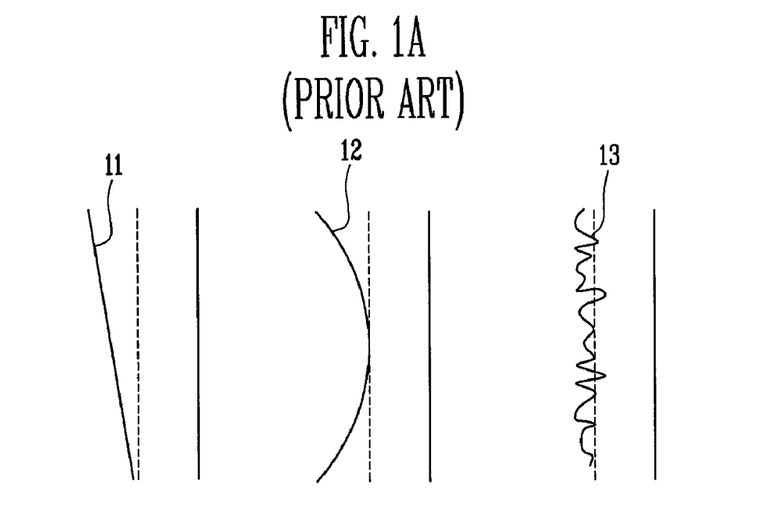
FIGS. 1A through 1C are diagrams for explaining the problems of morphological defects, scallops, etch retardation, and footings caused to a silicon (Si) substrate etched using a deep reactive ion etch (DRIE) technique.
Figure 1B:
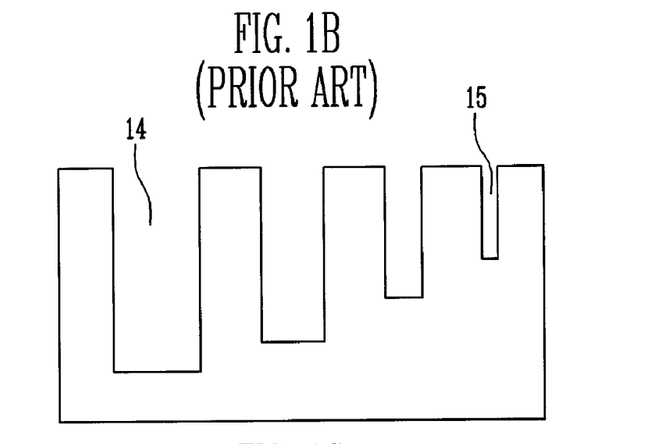
Figure 1C:
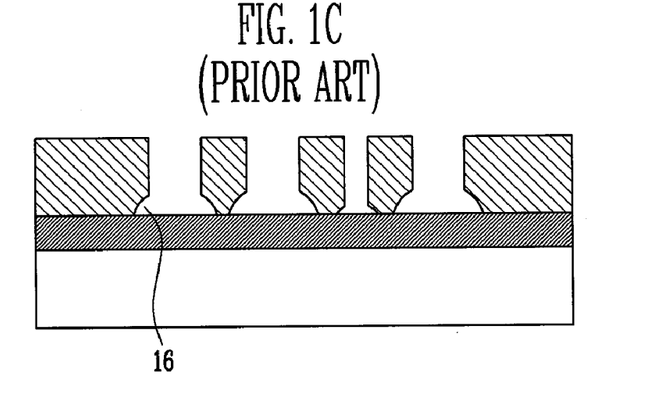

FIGS. 1A through 1C are diagrams for explaining the problems of morphological defects, scallops, etch retardation, and footings caused to a Si substrate etched using a DRIE technique.

Referring to FIG. 1A, when the Si substrate is etched using a DRIE technique, morphological defects, such as parallel deviation 11 or spherical deviation 12, may be caused or scallops 13 may occur, causing roughening of the etched vertical surface.

Referring to FIG. 1B, microloading effect 14 and 15 may occur such that a large-area space is etched faster than a small-area space. Referring to FIG. 1C, footings 16 may occur due to reactive ions generated during the etching process such that an etch end-point is etched excessively.

As described above, when a Si substrate is etched using a DRIE technique, etched vertical surfaces are seriously damaged due to morphological defects, scallops, microloading effect, and footings, thereby adversely affecting the performances of MEMS devices using micro-vertical structures, such as sensors, optical switches, and optical filters.

In addition, after a DRIE process is performed, a micro-vertical structure floats and thus, it is difficult to perform subsequent processes, such as a dicing process.

SUMMARY OF THE INVENTION

The present application is directed to a method of fabricating a micro-vertical structure, which minimizes morphological defects and footings caused by a deep reactive ion etch (DRIE) technique.

Also, the present application is directed to a method of fabricating a micro-vertical structure, which prevents the micro-vertical structure from floating to facilitate subsequent processes.

One exemplary embodiment of the present invention is to provide a method of fabricating a micro-vertical structure. The method includes: forming an insulating layer on a first crystalline silicon (Si) substrate and patterning the insulating layer to form an insulating layer pattern and a first cavity for preventing occurrence of footings; bonding a second crystalline Si substrate onto the insulating layer pattern and etching the second crystalline Si substrate using a deep reactive ion etch (DRIE) process, wherein the second crystalline Si substrate is etched along a crystal plane vertical to the second crystalline Si substrate; and etching an etched vertical surface of the second crystalline Si substrate using a crystalline wet etching process to form the micro-vertical structure having a vertical surface vertical to the second crystalline Si substrate.

In forming the insulating layer, the insulating layer may be patterned such that the first cavity is disposed under an etch end-point of the second crystalline silicon substrate.

Reactive ions generated during the DRIE process of the second crystalline silicon substrate may be emitted through the first cavity, thereby preventing occurrence of footings.

The second crystalline Si substrate may be a (110) crystalline Si substrate. Also, the crystal plane vertical to the second crystalline Si substrate may be a [111] crystal plane.

The micro-vertical structure may be fixed to the first crystalline Si substrate by the insulating layer pattern. Alternatively, the insulating layer pattern may be removed to float the micro-vertical structure.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

The present invention will be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to one skilled in the art.

Figure 2:
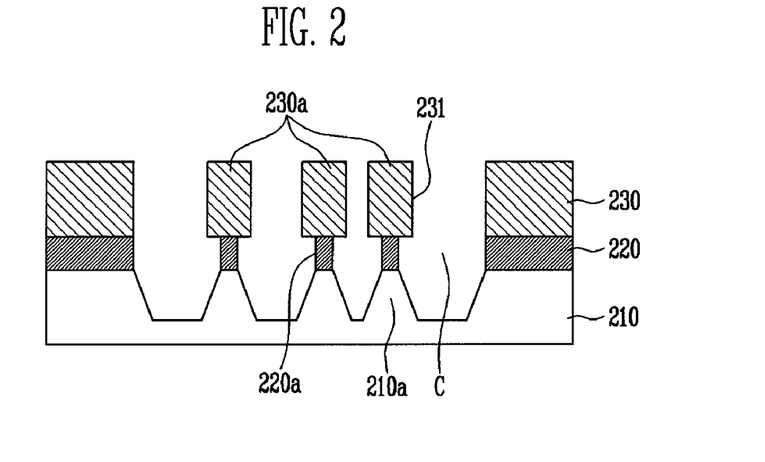
FIG. 2 is a cross-sectional view of a micro-vertical structure according to an exemplary embodiment of the present invention.

FIG. 2 is a cross-sectional view of a micro-vertical structure according to an exemplary embodiment of the present invention.

Referring to FIG. 2, formation of the micro-vertical structure 230a according to the present invention may involve bonding a second crystalline silicon (Si) substrate 230 to a first crystalline Si substrate 210 by interposing an insulating layer pattern 220a and a cavity C therebetween, and etching the second crystalline Si substrate 230 using a deep reactive ion etch (DRIE) process and a crystalline wet etching process.

In this case, the second crystalline Si substrate 230 may be a (110) crystalline Si substrate.

The insulating layer pattern 220a and the cavity C may function to prevent occurrence of footings during the DRIE process of the second crystalline Si substrate 230. This will be described in detail later.

The micro-vertical structure 230a may have a planar vertical surface 231 without morphological defects due to the DRIE process and the crystalline wet etching process. This will now be described in more detail.

Figure 3:
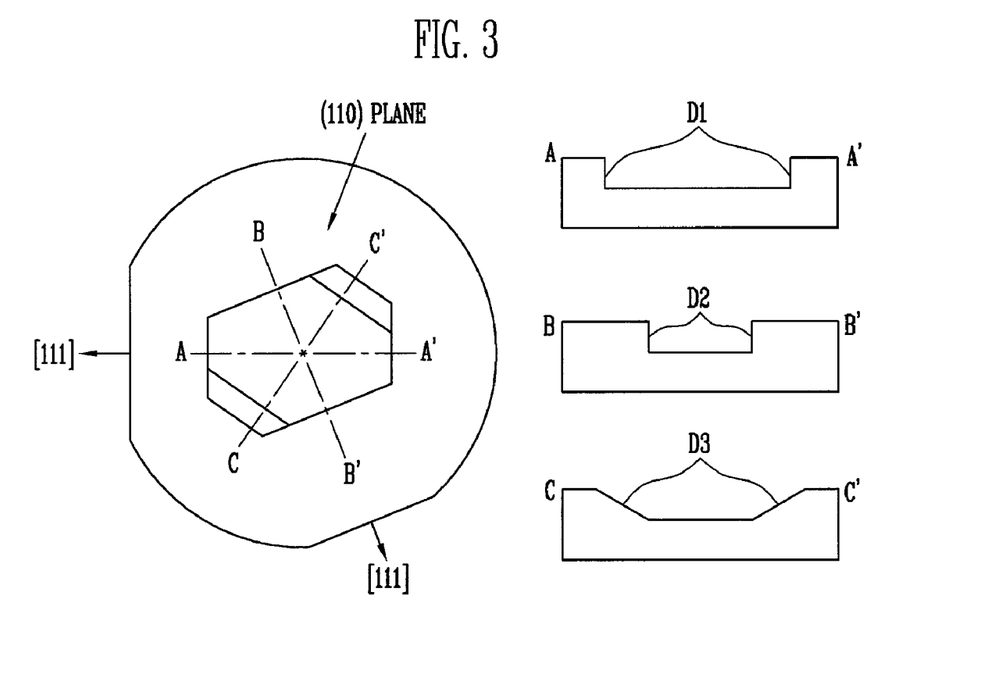
FIG. 3 is a diagram for explaining a [111] crystal plane of a (110) crystalline Si substrate used in the exemplary embodiment of the present invention.

FIG. 3 is a diagram for explaining a [111] crystal plane of the (110) crystalline Si substrate used in the present invention.

Referring to FIG. 3, the (110) crystalline Si substrate may have four [111] crystal planes D1 and D2, which are vertical to the (110) crystalline Si substrate, and two inclined crystal planes D3.

Accordingly, when the (110) crystalline Si substrate is etched using a DRIE process along the [111] crystal planes D1 and D2 vertical to the substrate and then, etched vertical surfaces are etched using a crystalline wet etching process, no morphological defects occur on the etched vertical surfaces.

That is, the present invention uses the fact that the [111] crystal plane of the second crystalline Si substrate 230 is vertical to the substrate 230. Thus, the second crystalline Si substrate 230 is etched using a DRIE process such that an etched vertical surface 230 is oriented toward the [111] crystal plane, and the surface roughness and flatness of the etched vertical surface 231 are improved using a crystalline wet etching process, thereby preventing morphological defects from occurring on the etched vertical surface 230.

In addition to the prevention of the morphological defects, the present invention further includes a process of forming the insulating layer pattern 220a and the cavity C under the second crystalline Si substrate 230 to prevent footings from occurring on the etched vertical surface 231 due to the insulating layer pattern 220a and the cavity C. This will now be described in more detail with reference to FIGS. 4A and 4B.

Figure 4A:
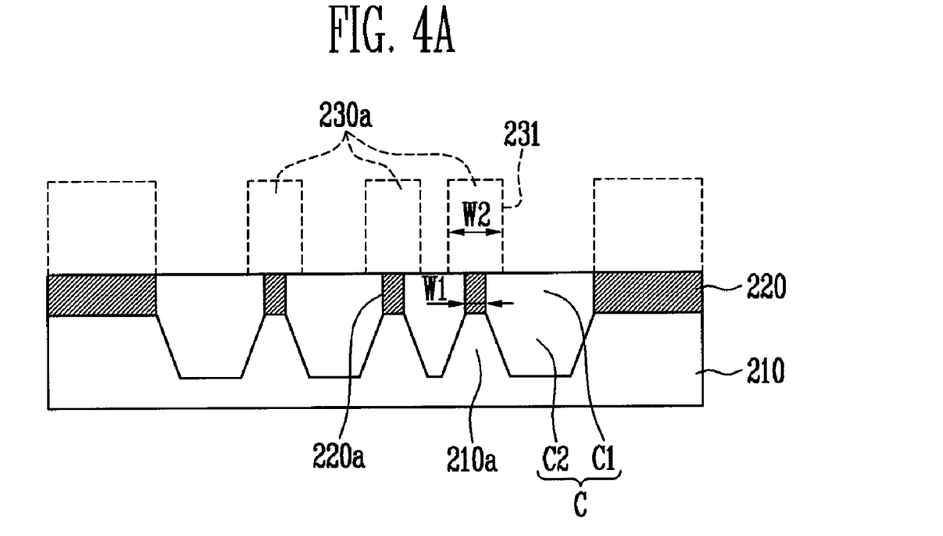
FIGS. 4A and 4B are cross-sectional views illustrating the function of an insulating layer pattern and a cavity disposed under a second crystalline Si substrate in the micro-vertical structure of FIG. 2.
Figure 4B:
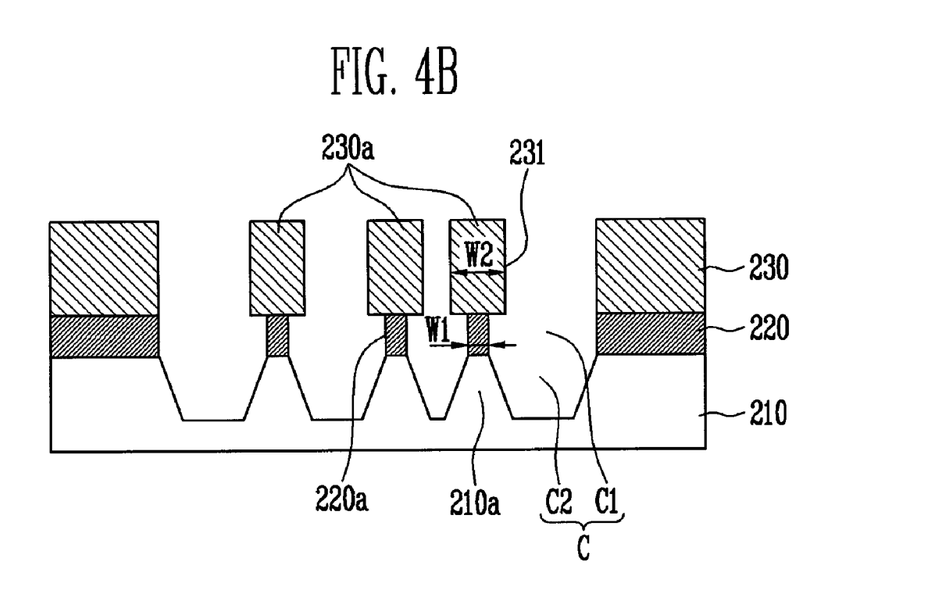

FIGS. 4A and 4B are cross-sectional views illustrating the function of the insulating layer pattern 220a and the cavity C disposed under the second crystalline Si substrate in the micro-vertical structure of FIG. 2.

Referring to FIG. 4A, the insulating layer 220 formed on the first crystalline Si substrate 210 may be patterned, thereby forming the insulating layer pattern 220a. In this case, a first cavity C1 is formed on the first crystalline Si substrate 210 due to the insulating layer pattern 220a.

The insulating layer pattern 220a may not be formed but the first cavity may be formed at an etch end-point of the micro-vertical structure 230a that will be formed later. In this case, when the second crystalline Si substrate 230 is etched using a DRIE process to form the micro-vertical structure 230a, reactive ions generated during the etching process do not accumulate at the etch end-point but are emitted through the first cavity C1, thereby preventing the occurrence of footings.

Thereafter, a partial thickness of the first crystalline Si substrate 210 may be etched, thereby forming a support structure 210a. In this case, a second cavity C2 is also formed on the first crystalline Si substrate 210 due to the support structure 210a. When the second crystalline Si substrate 230 is bonded to the first crystalline Si substrate 210, the second cavity C2 may prevent the first and second crystalline Si substrate 210 and 230 from sticking to each other. Here, the first cavity C1 and the second cavity C2 may be put together and considered as one cavity C.

Referring to FIG. 4B, after the second crystalline Si substrate 230 is bonded to the insulating layer pattern 220a, the second crystalline Si substrate 230 may be etched using a DRIE process. As a result, footings do not occur on the etched vertical surface 231 due to the insulating layer pattern 220a and the first cavity C1.

Meanwhile, when the insulating layer 220 is completely removed from a portion where the micro-vertical structure 230a will be formed in order to prevent occurrence of footings, after the DRIE process is carried out, the micro-vertical structure 230a may float in the air. As a result, the micro-vertical structure 230a may be deformed or damaged during an additional subsequent process.

Therefore, the insulating layer 220 may not be completely removed, so that even after the DRIE process is finished, the micro-vertical structure 230a can be fixed to the first crystalline Si substrate 210 without floating in the air.

For this reason, according to the present invention, the micro-vertical structure 230a may be fixed to the first crystalline Si substrate 210 by the insulating layer pattern 220a and the support structure 210a, and, after an additional process is performed, the insulating layer pattern 220a is completely removed to float the micro-vertical structure 230a.

As described above, the micro-vertical structure fabricated according to the present invention can have the planar vertical surface 231 without morphological defects or footings. Also, even if an additional process is performed, the deformation or damage of the micro-vertical structure can be prevented due to the insulating layer pattern 220a and the support structure 210a.

Hereinafter, a method of fabricating a micro-vertical structure according to an exemplary embodiment of the present invention will be described in more detail with reference to FIGS. 5A through 5J.

FIGS. 5A through 5J are cross-sectional views illustrating a method of fabricating a micro-vertical structure according to an exemplary embodiment of the present invention.

Figure 5A:
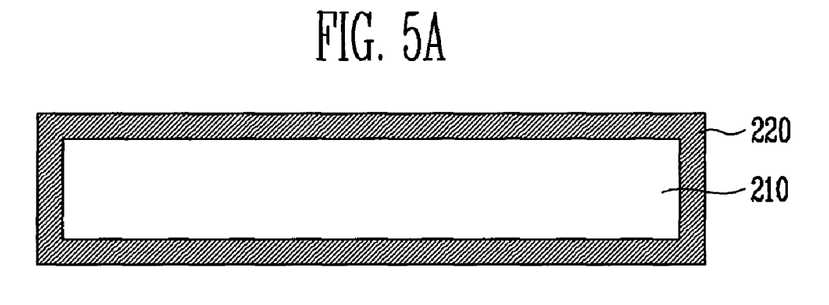
FIGS. 5A through 5J are cross-sectional views illustrating a method of fabricating a micro-vertical structure according to an exemplary embodiment of the present invention.

Referring to FIG. 5A, an insulating layer 220 may be formed on a first crystalline Si substrate 210.

Figure 5B:
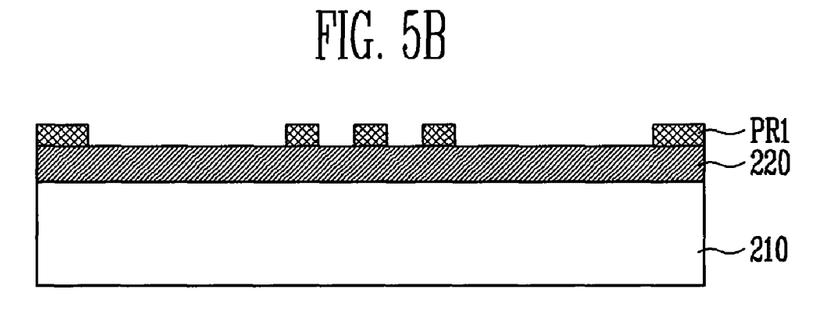

Referring to FIG. 5B, a first photoresist pattern PR1 may be formed using a photoresist process and a photolithography process.

Figure 5C:
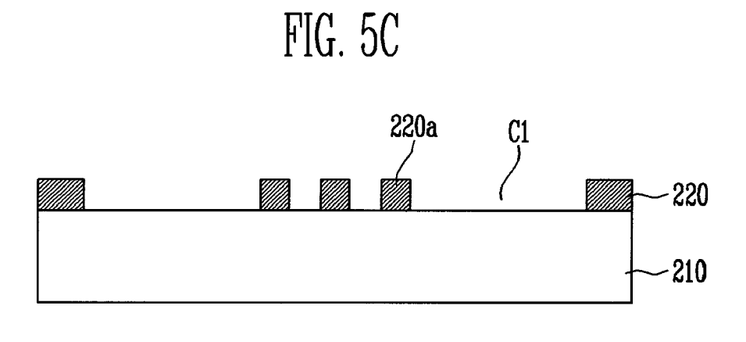

Referring to FIG. 5C, the insulating layer 220 may be patterned using the first photoresist pattern PR1 and a buffered oxide etcher (BOE) solution, thereby forming the insulating layer pattern 220a and the first cavity C1.

Figure 5D:
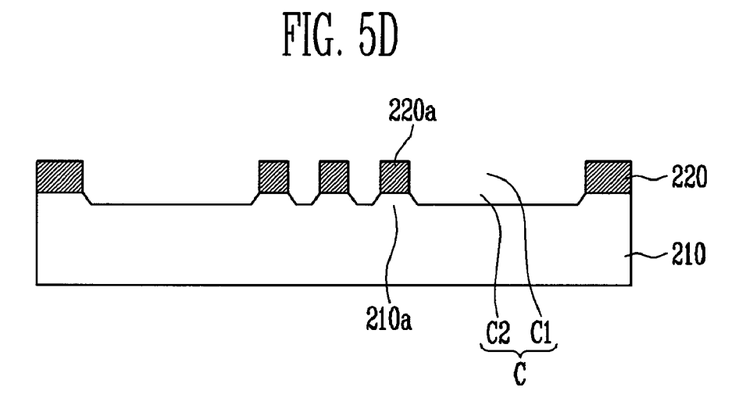

Referring to FIG. 5D, a partial thickness of the first crystalline Si substrate 210 may be etched using a tetramethyl ammonium hydroxide (TMAH) etchant, thereby forming a support structure 210a and the second cavity C2. In this case, an etched depth of the first crystalline Si substrate 210 may be controlled not to bond a second crystalline Si substrate 230 to the first crystalline Si substrate 210 during formation of the second crystalline Si substrate 230 on the insulating layer 220.

An etched portion of the first crystalline Si substrate 210 may function as the support structure 210a for supporting a micro-vertical structure. The support structure 210a may have a taper shape.

Figure 5E:
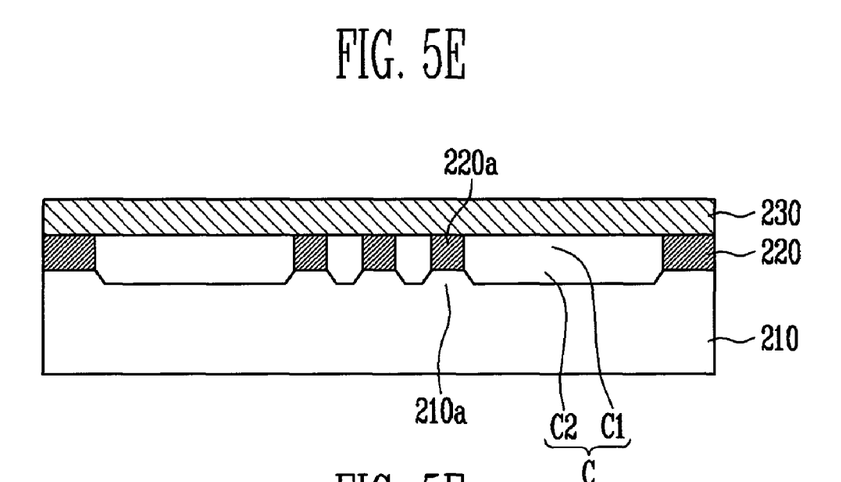

Referring to FIG. 5E, a second crystalline Si substrate 230 may be formed on the insulating layer 220 and planarized to a required thickness using a chemical mechanical polishing (CMP) process.

Figure 5F:
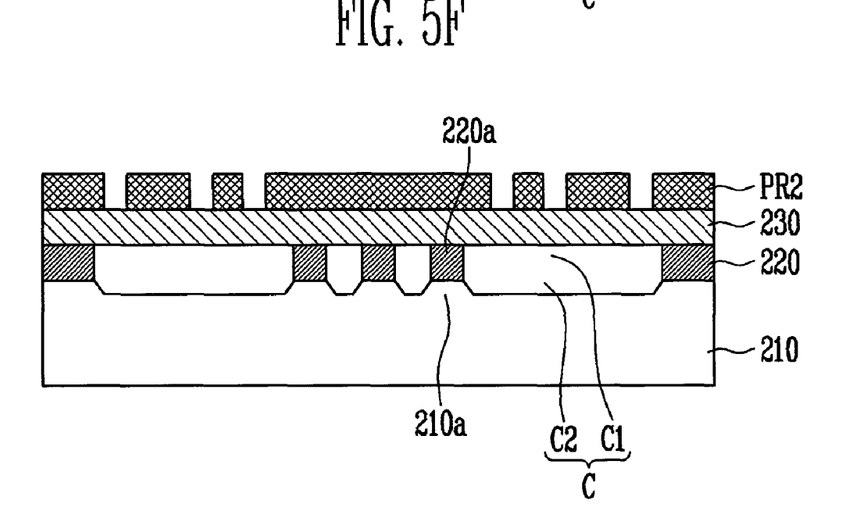

Referring to FIG. 5F, a photoresist pattern PR2 may be formed on the second crystalline Si substrate 230 using a photoresist process and a photolithography process. In this case, the second photoresist pattern PR2 may be formed in the shape of a micro-vertical structure.

Figure 5G:
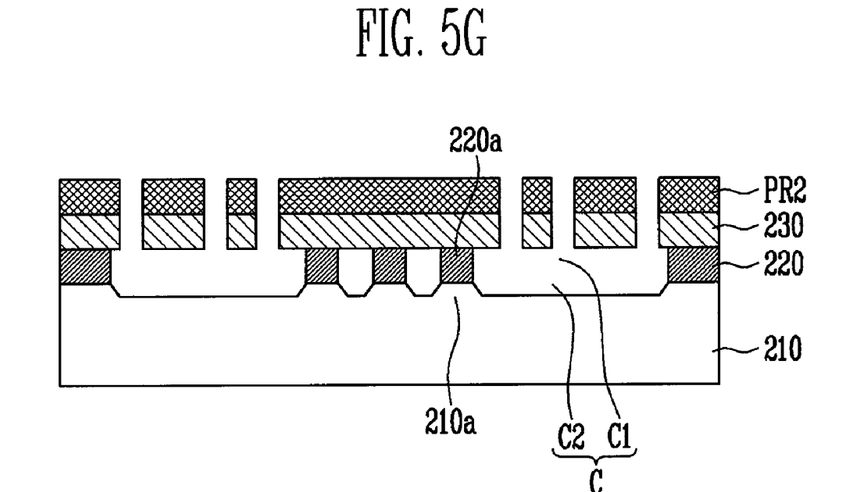

Referring to FIG. 5G, the second crystalline Si substrate 230 may be etched by a DRIE process using the second photoresist pattern PR2. In this case, since a primary flat surface of the second crystalline Si substrate 230 has [111] crystal planes (refer to D1 and D2 in FIG. 3) vertical to the second crystalline Si substrate 230, a vertical surface to be vertically planarized may be oriented toward the [111] crystal plane and etched.

Figure 5H:
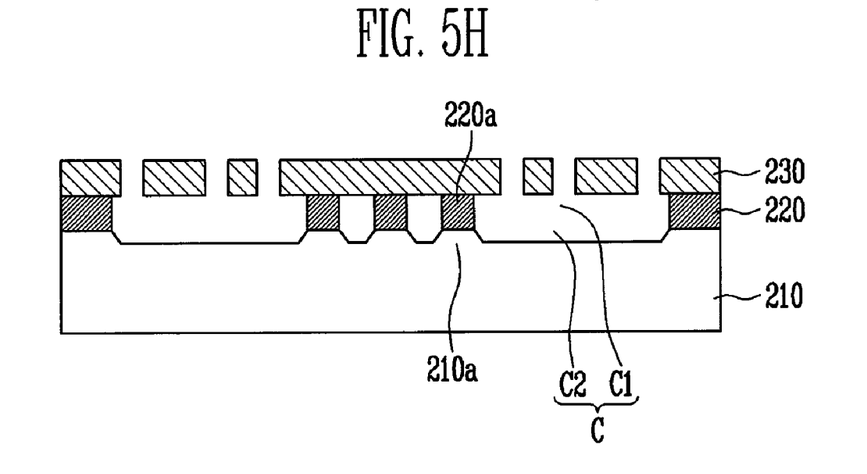

Referring to FIG. 5H, after the DRIE process is finished, the second photoresist pattern PR2 may be removed.

Figure 5I:
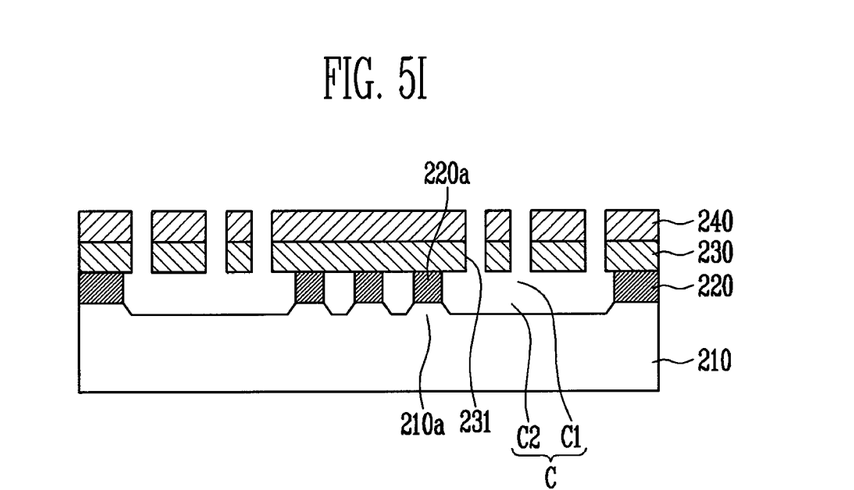

Referring to FIG. 5I, an oxide layer 240 may be deposited on the etched top surface of the second crystalline Si substrate 230 using a plasma enhanced chemical vapor deposition (PECVD) process. Thereafter, a vertical surface 231 of the second crystalline Si substrate 230 may be etched by a crystalline wet etching process using a potassium hydroxide (KOH) solution, thereby improving the surface roughness and flatness of the etched vertical surface 231. In this case, the oxide layer 240 may protect an upper portion of the second crystalline Si substrate 230 during the etching process using the KOH solution.

Figure 5J:
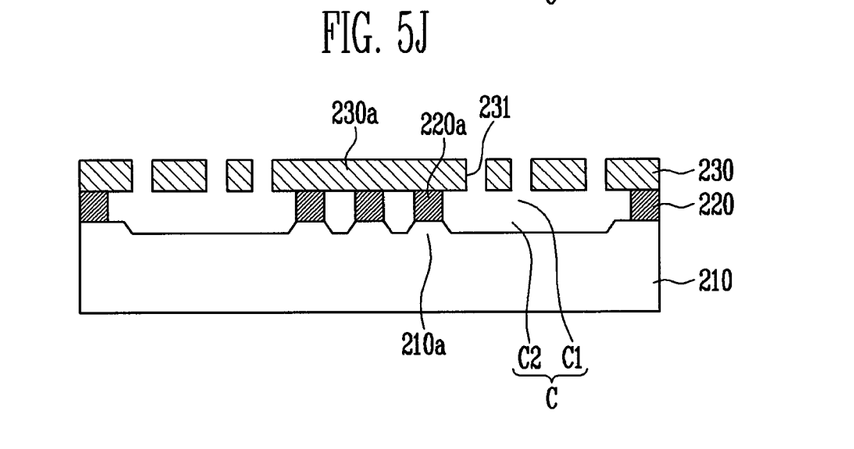

Referring to FIG. 5J, the oxide layer 240 may be removed using a etching process. As a result, a micro-vertical structure 230a having the planar vertical surface 231 without morphological defects or footings can be fabricated.

In this case, when no additional process is required, the insulating layer pattern 220a may be removed so that the micro-vertical structure 230a can float in the air.

Figure 6A:
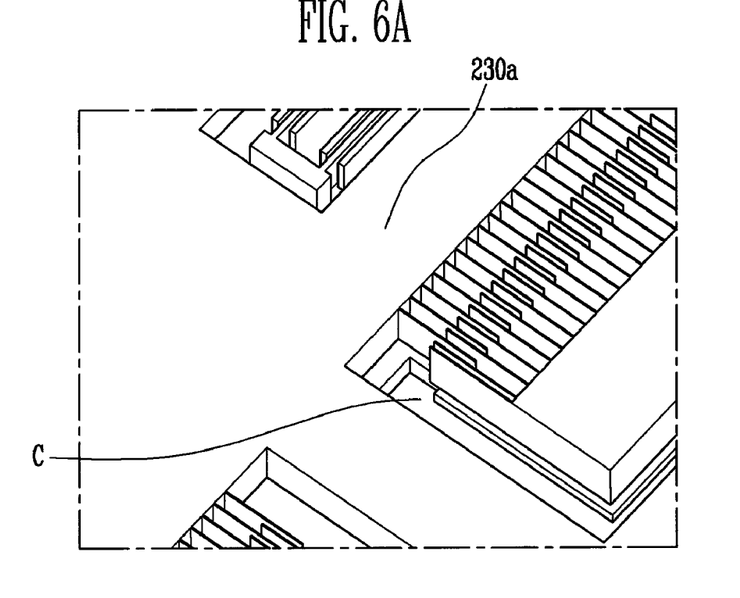
FIGS. 6A and 6B are scanning electron microscope (SEM) photographs of a micro-vertical structure fabricated according to an exemplary embodiment of the present invention.
Figure 6B:
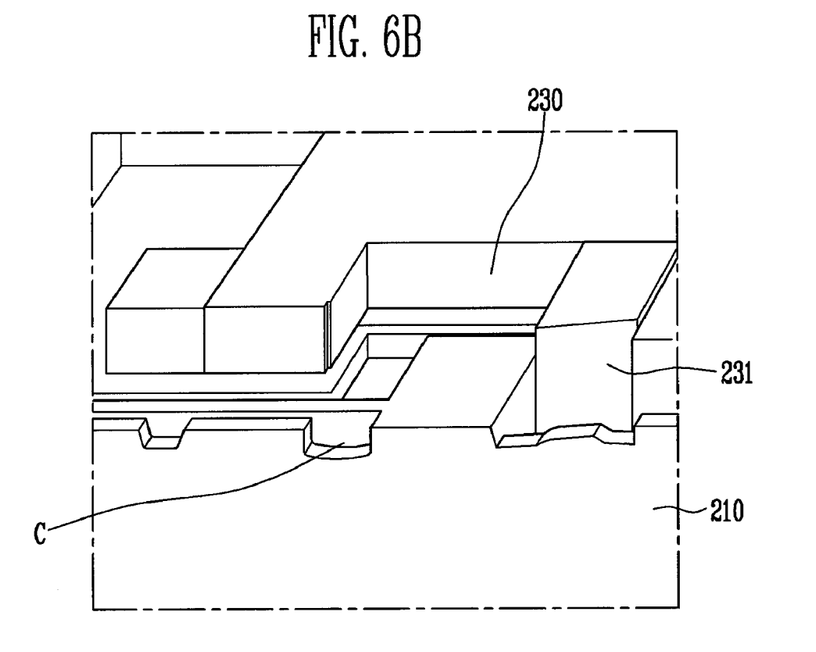

Thus, according to the method of the present invention, the occurrence of morphological defects and footings on the vertical surface 231 of the micro-vertical structure 230a can be minimized as shown in FIGS. 6A and 6B.

FIGS. 6A and 6B are scanning electron microscope (SEM) photographs of the micro-vertical structure fabricated according to an exemplary embodiment of the present invention.

Referring to FIGS. 6A and 6B, it can be observed that the micro-vertical structure 230a had the planar vertical surface 231 without morphological defects or footings and a cavity C deepened.

Figure 7A:
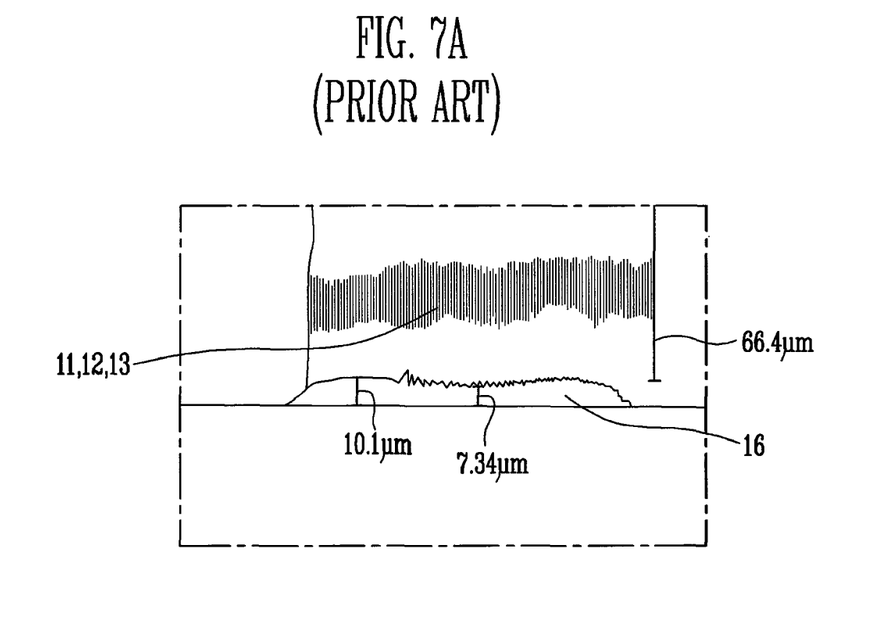
FIG. 7A is an SEM photograph of a Si substrate etched using a conventional DRIE technique.
Figure 7B:
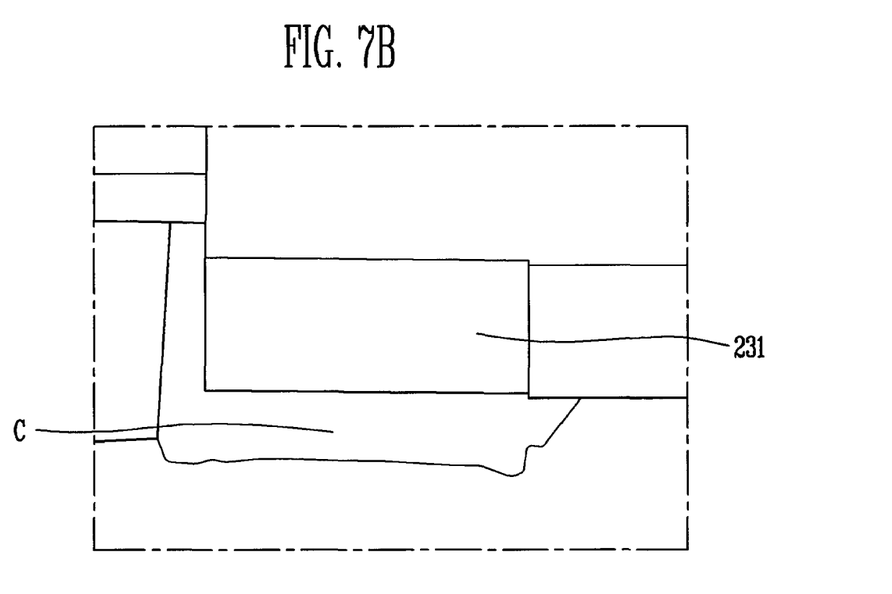
FIG. 7B is an SEM photograph of a crystalline Si substrate etched using a DRIE technique and a crystalline wet etching technique according to the present invention.

FIG. 7A is an SEM photograph of a Si substrate etched using a conventional DRIE technique, and FIG. 7B is an SEM photograph of a crystalline Si substrate etched using a DRIE technique and a crystalline wet etching technique according to the present invention.

Referring to FIG. 7A, when the Si substrate was etched using the conventional DRIE process, very serious morphological defects 11, 12, and 13 and a footing 16 occurred on a vertical surface of a micro-vertical structure. In contrast, referring to FIG. 7B, when the crystalline Si substrate was etched using the DRIE process and crystalline wet etching process according to the present invention, morphological defects and footings were hardly found on a vertical surface 231 of a micro-vertical structure.

According to the present invention as described above, when the second crystalline Si substrate 230 is etched using a DRIE process, after the etched vertical surface 231 is oriented toward the [111] crystal plane and etched, the surface roughness and flatness of the etched vertical surface 231 may be improved using a crystalline wet etching process. As a result, morphological defects of the etched vertical surface 231 can be minimized. Also, no footing occurs at the etch end-point due to the insulating layer pattern 220a and the cavity C. Furthermore, the micro-vertical structure 230 may be prevented from floating, thereby facilitating additional subsequent processes.

A micro-vertical structure fabricated according to the present invention can have a planar vertical surface without morphological defects or footings. Therefore, it is expected that the micro-vertical structure will greatly improve the performances of micro-electro-mechanical systems (MEMS) devices, such as capacitive sensors and optical devices, which require good vertical surfaces.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of fabricating a micro-vertical structure, comprising:
    forming an insulating layer on a first crystalline silicon substrate and patterning the insulating layer to form an insulating layer pattern and a first cavity for preventing occurrence of footings;
    bonding a second crystalline silicon substrate onto the insulating layer pattern and etching the second crystalline silicon substrate using a deep reactive ion etch (DRIE) process, wherein the second crystalline silicon substrate is etched along a crystal plane vertical to the second crystalline silicon substrate; and
    etching an etched vertical surface of the second crystalline silicon substrate using a crystalline wet etching process to form the micro-vertical structure having a vertical surface vertical to the second crystalline silicon substrate.

2. The method according to claim 1, wherein in forming the insulating layer, the insulating layer is patterned such that the first cavity is disposed under an etch end-point of the second crystalline silicon substrate.

3. The method according to claim 1, wherein the forming the insulating layer further comprises etching a partial thickness of the first crystalline silicon substrate to form a support structure and a second cavity after forming the insulating layer pattern and the first cavity.

4. The method according to claim 1, wherein the second crystalline silicon substrate is a (110) crystalline silicon substrate.

5. The method according to claim 4, wherein the crystal plane vertical to the second crystalline silicon substrate is a [111] crystal plane.

6. The method according to claim 1, wherein, reactive ions generated during the DRIE process of the second crystalline silicon substrate are emitted through the first cavity.

7. The method according to claim 1, further comprising depositing an oxide layer on the second crystalline silicon substrate before etching the second crystalline silicon substrate using the crystalline wet etching process.

8. The method according to claim 1, wherein the micro-vertical structure is fixed to the first crystalline silicon substrate by the insulating layer pattern.

9. The method according to claim 1, further comprising removing the insulating layer pattern to float the micro-vertical structure.

* * * * *